United States Patent
Lee et al.

(10) Patent No.: US 8,277,701 B2
(45) Date of Patent: Oct. 2, 2012

(54) PHOTOSENSITIVE RESIN COMPOSITION FOR COLOR FILTER AND COLOR FILTER USING SAME

(75) Inventors: Chang-Min Lee, Uiwang-si (KR);
Kil-Sung Lee, Uiwang-si (KR);
Jun-Seok Kim, Uiwang-si (KR);
Seong-Yong Uhm, Uiwang-si (KR);
Sang-Won Cho, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/195,094

(22) Filed: Aug. 1, 2011

(65) Prior Publication Data

US 2012/0112140 A1    May 10, 2012

(30) Foreign Application Priority Data

Nov. 8, 2010 (KR) .................. 10-2010-0110577

(51) Int. Cl.
G02B 5/23 (2006.01)
C08F 2/50 (2006.01)
C08F 2/46 (2006.01)
C08J 3/28 (2006.01)
G03F 7/033 (2006.01)
G03F 7/032 (2006.01)

(52) U.S. Cl. .................. 252/586; 430/270.1; 430/281.1; 430/286.1; 430/287.1; 430/293; 522/71; 522/74; 522/79; 522/80; 522/81; 522/101; 522/103; 522/104; 522/113; 522/120; 522/123; 522/149; 522/153; 522/154; 522/178; 522/182; 522/183

(58) Field of Classification Search .................. 252/586; 430/7, 270.1, 281.1, 286.1, 287.1, 293; 522/33, 522/42, 46, 53, 63, 78, 79, 182, 71, 74, 80, 522/81, 101, 103, 104, 113, 120, 123, 149, 522/153, 154, 178, 183

See application file for complete search history.

(56) References Cited

U.S. PATENT DOCUMENTS

| 5,998,091 | A | 12/1999 | Suzuki |
| 2005/0112501 | A1* | 5/2005 | Ikegami et al. ............ 430/281.1 |
| 2010/0160474 | A1 | 6/2010 | Lee et al. |
| 2010/0216073 | A1 | 8/2010 | Kim et al. |

FOREIGN PATENT DOCUMENTS

| EP | 0725315 A2 | 8/1996 |
| JP | 03-050271 | 3/1991 |
| JP | 07-140654 | 6/1995 |
| JP | 10-254133 | 9/1998 |
| JP | 2003-149810 * | 5/2003 |
| KR | 10-1992-7002502 | 9/1992 |
| KR | 10-1993-7000858 | 3/1993 |
| KR | 10-1994-0005617 B1 | 6/1994 |
| KR | 10-1995-7000359 | 1/1995 |
| KR | 10-1995-0011163 B1 | 9/1995 |
| KR | 10-1995-7003746 | 9/1995 |
| KR | 10-1996-0029904 | 8/1996 |
| KR | 10-2002-0066504 A | 8/2002 |
| KR | 10-2009-0024561 A | 3/2009 |
| KR | 10-2009-0066600 A | 6/2009 |

OTHER PUBLICATIONS

Office Action in commonly owned U.S. Appl. No. 13/238,424 mailed Jan. 6, 2012, pp. 1-13.

* cited by examiner

*Primary Examiner* — Bijan Ahvazi

(74) *Attorney, Agent, or Firm* — Summa, Addition & Ashe, P.A.

(57) ABSTRACT

Disclosed are a photosensitive resin composition for a color filter and a color filter using the same. The photosensitive resin composition for a color filter includes (A) an acrylic-based binder resin including a structural unit represented by the following Chemical Formula 1, wherein the substituents of Chemical Formula 1 are the same as defined in the specification; (B) an acrylic-based photopolymerizable monomer; (C) a photopolymerization initiator; (D) a pigment; and (E) a solvent.

[Chemical Formula 1]

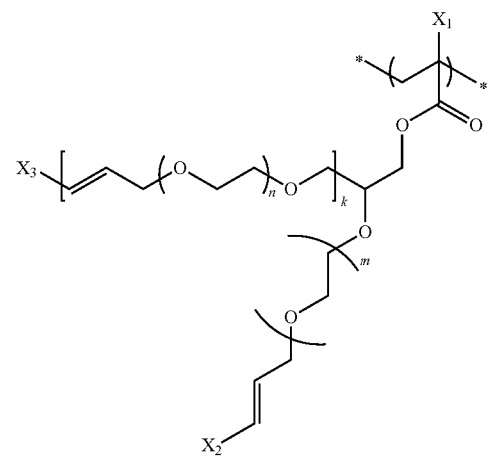

10 Claims, 3 Drawing Sheets

PHOTOSENSITIVE RESIN COMPOSITION FOR COLOR FILTER AND COLOR FILTER USING SAME

CROSS-REFERENCE TO RELATED APPLICATION

This application claims priority under 35 USC Section 119 to and the benefit of Korean Patent Application No. 10-2010-0110577 filed in the Korean Intellectual Property Office on Nov. 8, 2010, the entire disclosure of which is incorporated herein by reference.

FIELD OF THE INVENTION

The present invention relates to a photosensitive resin composition for a color filter and a color filter using the same.

BACKGROUND OF THE INVENTION

Color filters are used for liquid crystal displays (LCD), optical filters for cameras, and the like. Color filters may be fabricated by coating a fine region with three or more colors on a charge-coupled device or a transparent substrate. The colored thin film can be fabricated by dyeing, printing, electrophoretic deposition (EPD), pigment dispersion, and the like.

The dyeing method forms a colored film by forming an image on a glass substrate with a dyeing agent and then dyeing the image with direct dyes. Examples of the dyeing agent used in fabricating colored thin films include natural photosensitive resins such as gelatin and the like, amine-modified polyvinyl alcohols, amine-modified acryl-based resins, and the like. However, the dyeing process may be complex and lengthy, since it should include resist-printing whenever a color needs to be changed to form a multicolored thin film on the same substrate. In addition, many generally-used dyes and resins may have good color vividness and dispersion but also poor color fastness, water resistance, and heat resistance, which are very important characteristics. For example, azo and azide compounds have been used as a dye but have deteriorated heat resistance and durability compared with a pigment.

The printing method forms a colored thin film by printing an ink prepared by dispersing a pigment into a thermally curable or photocurable resin and curing it with heat or light. This method may decrease material costs compared with other methods, but it is difficult to form a fine and precise image and to acquire a uniform thin film layer. Korean Patent Laid-Open Publication No. 1995-7003746 discloses a method of making a color filter using an inkjet method. However, the resultant color filter suffers similar problems to a color filter made using the dyeing method, for example, deteriorated durability and heat resistance, because this inkjet printing method also uses a dye-type color resist composition and disperses it from a nozzle to accomplish fine and precise color Printing.

Korean Patent Laid-Open Publication Nos. 1993-7000858 and 1996-0029904 disclose an electrophoretic deposition (EPD) method using an electric precipitation method. The electrophoretic deposition (EPD) can form a precise color film having excellent heat resistance and color fastness, since it uses a pigment. However, this method may not be capable of producing a highly precise color filter requiring a finer electrode pattern for future, more precise pixels because it may produce a colored film that is stained or thicker at both ends due to electrical resistances.

The pigment dispersion method forms a colored film by repeating a series of processes such as coating, exposing to a light, developing, and curing a photopolymer composition including a coloring agent on a transparent substrate including a black matrix. The pigment dispersion method can improve heat resistance and durability, which are very important characteristics for a color filter, and can provide a film with a uniform thickness. For example, Korean Patent Laid-Open Publications Nos. 1992-7002502, 1994-0005617, 1995-7000359, 1994-0005617, and 1995-0011163 disclose a method of preparing a photosensitive resin composition for a color filter using a pigment dispersion method.

In this pigment dispersion method, a photosensitive resin composition for a color filter generally includes a binder resin, a photopolymerization monomer, a photopolymerization initiator, an epoxy resin, a solvent, and other additives. For example, the binder resin may include a carboxyl-containing acrylic-based copolymer in Japanese Patent Laid-Open Publications Pyung 7-140654 and 10-254133.

The color filter is prepared using many chemical treatments during the manufacturing process. Accordingly, a color photosensitive resin should have a development margin and also chemical resistance sufficient to improve yields of a color filter and to maintain a pattern formed under the aforementioned conditions.

In particular, a conventional color liquid crystal display (LCD) is generally fabricated by preparing a color filter substrate for displaying a color image separately from an operating substrate on which a thin film transistor (TFT) array is disposed and then, binding the color filter substrate and the operating substrate together. However, since there can be low arrangement accuracy during the binding step, conventional color liquid crystal displays can require a shading layer with a large width. Accordingly, it is difficult to increase the aperture ratio (a ratio of an active light-emitting area to a total pixel area). In addition, because the glass substrate and LCD screen have recently become larger, it takes longer for a liquid crystal composition to cover the front side of the substrates during vacuum injection.

A method has been suggested to sharply decrease the time needed to print a seal material and drip a liquid crystal to form an over-coat. The method, however, results in sharply deteriorated arrangement accuracy.

A method for forming a color filter on the operating TFT array substrate of a TFT color liquid crystal display (LCD) has also been suggested. Since this method does not need a color filter substrate and fabricates a transparent substrate by sputtering and binding two substrates, it has an advantage of simplifying the arrangement and increasing aspect rate.

However, when a color filter is formed on a TFT array substrate, a pixel electrode is formed on the color filter in a photolithography method by using a common positive photoresist. Accordingly, the resist layer needs to be removed after forming the electrode. In other words, a pixel electrode is formed by forming a transparent electrode layer on color pixels of a color filter, coating a positive resist composition thereon, and patterning it, exposing it to light, and developing it. Then, the resist layer remaining on the pixel electrode should be peeled and removed with a resist stripper. Accordingly, the positive resist composition requires resistance against the resist stripper. Conventional photosensitive resin compositions for color filters, however, typically have poor stripper-resistance.

Conventionally, a pixel electrode is fabricated by forming a transparent layer (a pixel protective layer) having stripper-resistance on a color filter. In addition, a pixel electrode can be fabricated without coating a pixel protective layer by treating a stripper at a low temperature for a longer time to decrease the stripper's influence on a color filter.

However, these conventional methods have problems of deteriorating yield rate and production efficiency, since they require more processes and longer times. In order to solve these problems, another method has been suggested, which includes using a radiation-sensitive composition with an expansion rate of less than 5% against a stripper to remove a cured layer forming a color layer in a COA method. Further, a color filter can have improved thermal polymerization cross-linking effects by using a multi-functional alicyclic epoxy compound as a thermal polymerization cross-linking agent and a benzophenone-based peroxide as a photo-thermal polymerization initiator.

According to this method, a color filter can be cured at a low temperature for a short time and thereby, can have excellent durability and close contacting (adhesion) properties. However, as the demand for larger screens with higher image quality than can be produced using conventional methods increases, there is also an increased need for a color filter with a higher aperture ratio and higher performance.

SUMMARY OF THE INVENTION

One embodiment of the present invention provides a photosensitive resin composition for a color filter that can have excellent heat resistance and chemical resistance.

Another embodiment of the present invention provides a color filter using the photosensitive resin composition for a color filter.

According to one embodiment of the present invention, a photosensitive resin composition for a color filter is provided that includes (A) an acrylic-based binder resin including a structural unit represented by the following Chemical Formula 1; (B) an acrylic-based photopolymerizable monomer; (C) a photopolymerization initiator; (D) a pigment; and (E) a solvent.

[Chemical Formula 1]

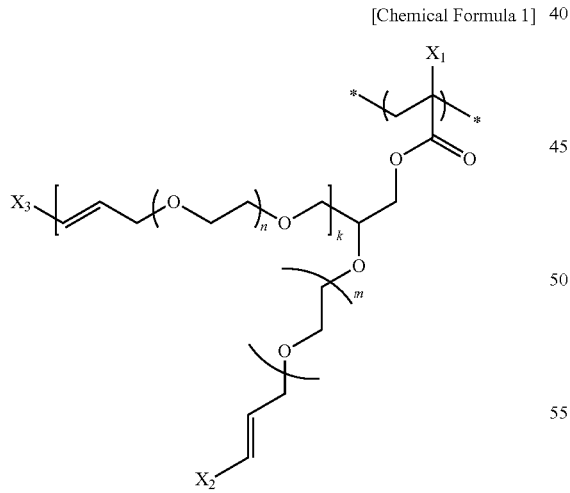

In Chemical Formula 1,
$X_1$ is H or C1 to C30 alkyl,
$X_2$ is substituted or unsubstituted C1 to C20 alkyl, C5 to C20 aryl, C6 to C20 alkylaryl, C3 to C20 cycloalkyl, or C6 to C30 multicycloalkyl,
$X_3$ is H, substituted or unsubstituted C1 to C20 alkyl, C5 to C20 aryl, C6 to C20 alkylaryl, C3 to C20 cycloalkyl, or C6 to C30 multicycloalkyl,
k is 0 or 1,
m is an integer ranging from 0 to 20, and
n is an integer ranging from 0 to 20,
wherein when k is 0, $X_3$ is hydrogen.

The structural unit represented by Chemical Formula 1 may be a structural unit represented by the following Chemical Formula 2 or Chemical Formula 3.

[Chemical Formula 2]

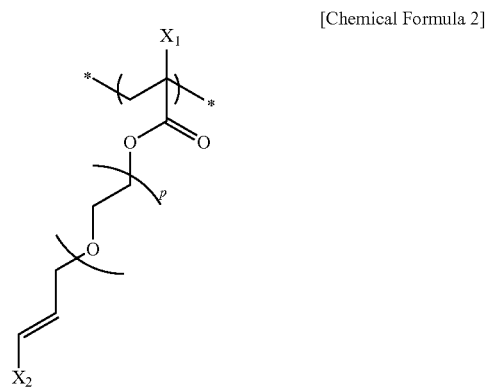

In Chemical Formula 2,
$X_1$ is H or C1 to C30 alkyl,
$X_2$ is substituted or unsubstituted C1 to C20 alkyl, C5 to C20 aryl, C6 to C20 alkylaryl, C3 to C20 cycloalkyl, or C6 to C30 multicycloalkyl, and
p is an integer ranging from 1 to 10.

[Chemical Formula 3]

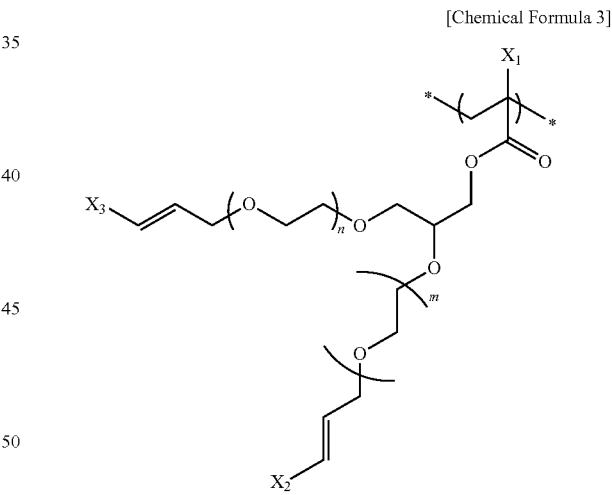

In Chemical Formula 3,
$X_1$ is H or C1 to C30 alkyl,
$X_2$ and $X_3$ are the same or different and are each independently substituted or unsubstituted C1 to C20 alkyl, C5 to C20 aryl, C6 to C20 alkylaryl, C3 to C20 cycloalkyl, or C6 to C30 multicycloalkyl,
m is an integer ranging from 0 to 20, and
n is an integer ranging from 0 to 20.

The acrylic-based binder resin (A) may include the structural unit represented by the above Chemical Formula 1 in an amount of about 0.05 to about 70 wt % based on the total weight of the acrylic-based binder resin (A).

The photosensitive resin composition for a color filter may include about 1 to about 60 wt % of the acrylic-based binder resin including the structural unit represented by the above Chemical Formula 1 (A); about 0.5 to about 40 wt % of the acrylic-based photopolymerizable monomer (B); about 0.1 to about 20 wt % of the photopolymerization initiator (C); about 0.1 to about 40 wt % of the pigment (D); and balance of the solvent (E).

The acrylic-based binder resin (A) including the structural unit represented by Chemical Formula 1 may have a weight average molecular weight (Mw) of about 1,000 to about 200,000.

The acrylic-based binder resin (A) including the structural unit represented by Chemical Formula 1 may have an acid value of about 20 to about 200 mgKOH/g.

The acrylic-based binder resin (A) including the structural unit represented by Chemical Formula 1 may further include at least one of the structural units represented by Chemical Formulae 4-1 to 4-5, or a combination thereof.

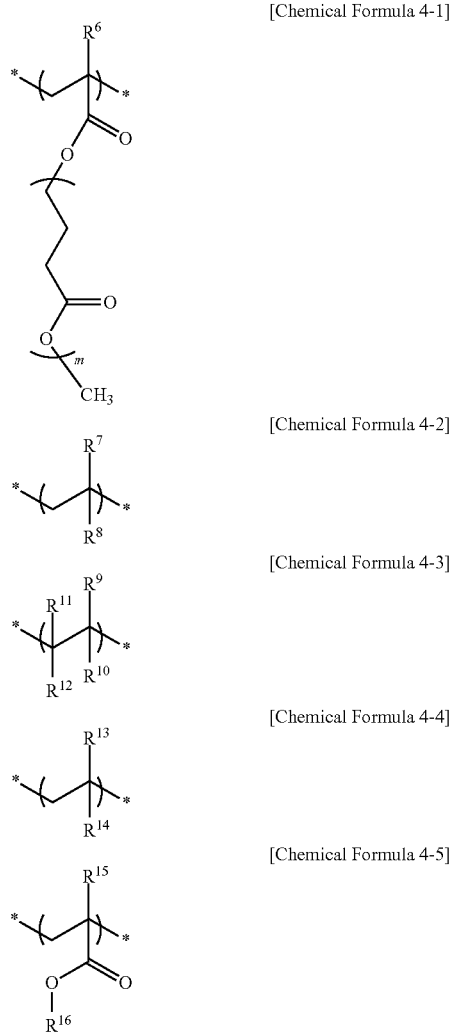

[Chemical Formula 4-1]

[Chemical Formula 4-2]

[Chemical Formula 4-3]

[Chemical Formula 4-4]

[Chemical Formula 4-5]

In Chemical Formulae 4-1 to 4-5, $R^6$, $R^7$, $R^9$, $R^{11}$, $R^{13}$ and $R^{15}$ are the same or different and are independently hydrogen or C1 to C10 alkyl, $R^8$ is hydrogen, halogen, hydroxyl, carboxyl, substituted or unsubstituted C1 to C20 alkyl, or COR'COOH (wherein R' is substituted or unsubstituted C1 to C20 alkylene or substituted or unsubstituted C1 to C20 alkoxylene), $R^{10}$ is carboxyl or CONHR" (wherein R" is substituted or unsubstituted C1 to C20 alkyl or substituted or unsubstituted C6 to C30 aryl), $R^{12}$ is carboxyl, or $R^{10}$ and $R^{12}$ are fused with each other to provide a ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

The acrylic-based binder resin (A) may induce at least one of the structural units represented by the above Chemical Formulae 4-1 to 4-5, or a combination thereof, in an amount ranging from about 1 to about 70 wt % based on the total weight of the acrylic-based binder resin (A).

The photosensitive resin composition may further include one or more additives comprising a dispersing agent; malonic acid; 3-amino-1,2-propanediol; a silane-based coupling agent including a vinyl group or a (meth)acryloxy group; a leveling agent; a fluorine-based surfactant; a radical polymerization initiator, or a mixture thereof.

According to another embodiment of the present invention, a color filter manufactured using the photosensitive resin composition for a color filter is provided.

Hereinafter, embodiments of the present invention will be described in detail.

The photosensitive resin composition for a color filter according to the present invention can have excellent heat resistance and chemical resistance and thus, excellent hole and patterning properties. Accordingly the photosensitive resin composition of the invention can be used to form a color filter on a TFT array substrate to provide a high aperture ratio and a high contrast ratio.

DETAILED DESCRIPTION

Figure 1:
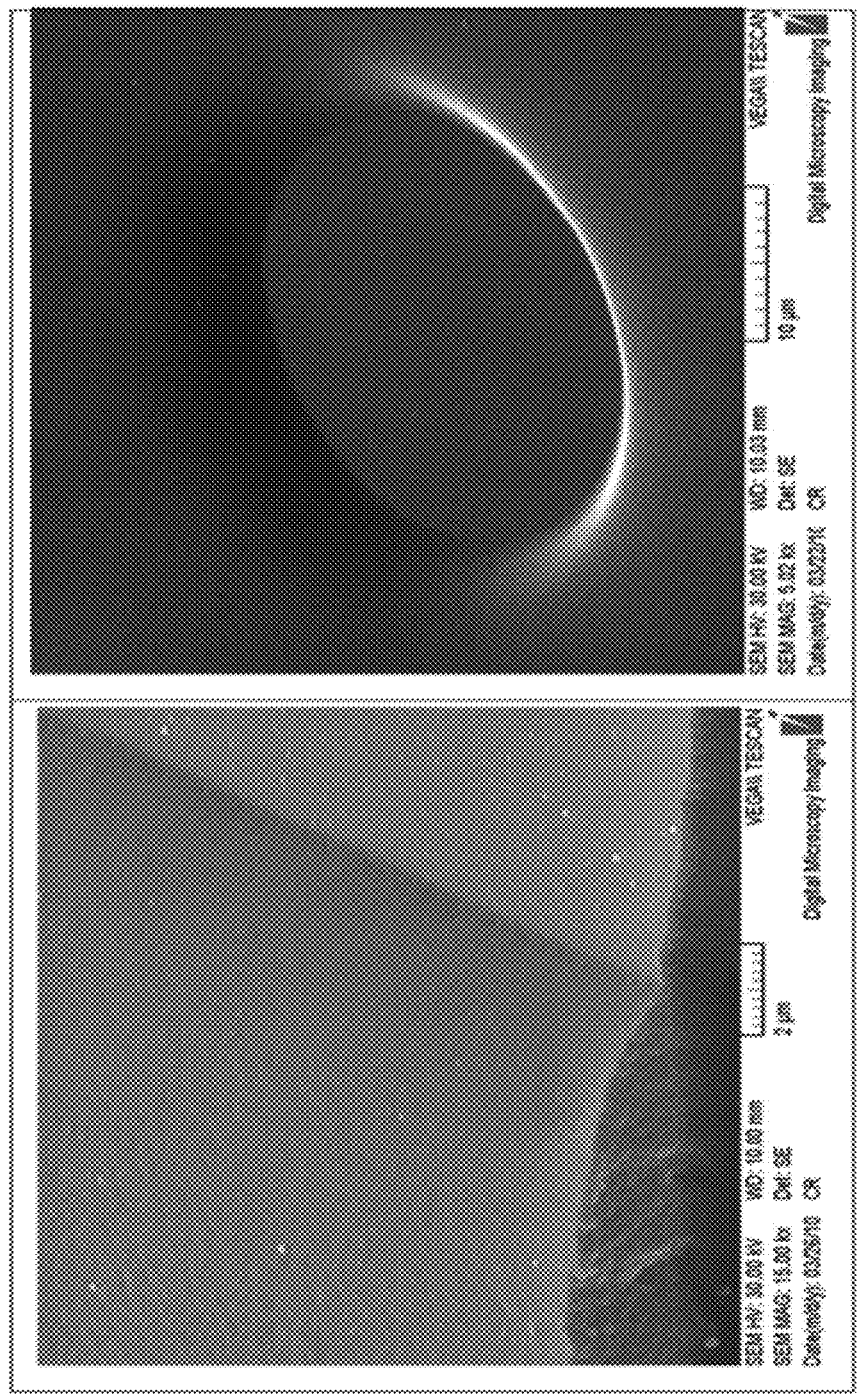
FIG. 1 is an electron scanning microscope photograph of the film manufactured using the photosensitive resin composition for a color filter according to Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C20 alkyl, the term "aryl" may refer to C6 to C30 aryl, the term "arylalkyl" may refer to C7 to C30 arylalkyl, the term "alkylene" may refer to C1 to C20 alkylene, and the term "alkoxylene" may refer to C1 to C20 alkoxylene.

As used herein, when a specific definition is not otherwise provided, the term "substituted" may refer to one substituted with a substituent comprising halogen (F, Cl, Br, or I), hydroxyl, nitro, cyano, imino (=NH, =NR, wherein R is C1 to C10 alkyl), amino (—NH$_2$, —NH(R'), —N(R")(R'"), wherein R' to R'" are independently C1 to C10 alkyl), amidino, hydrazine, hydrazone, carboxyl, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, in place of at least one hydrogen in a functional group.

As used herein, when a specific definition is not otherwise provided, the term "hetero" may refer to one substituted with N, O, S, P, or a combination thereof.

The photosensitive resin composition for a color filter according to one embodiment of the present invention includes (A) an acrylic-based binder resin including a structural unit represented by the following Chemical Formula 1; (B) an acrylic-based photopolymerizable monomer; (C) a photopolymerization initiator; (D) a pigment; and (E) a solvent.

[Chemical Formula 1]

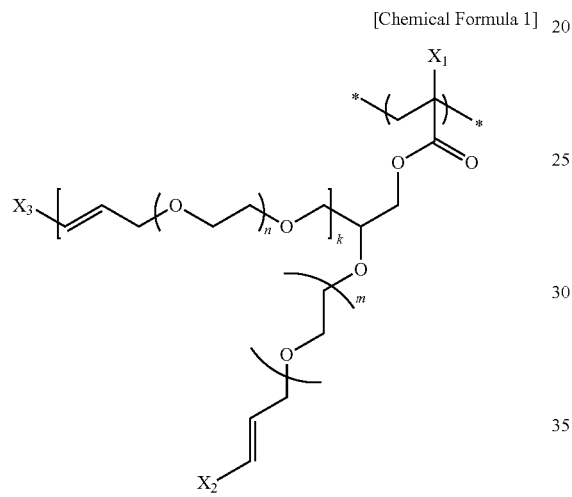

In Chemical Formula 1, $X_1$ is H or C1 to C30 alkyl, $X_2$ is substituted or unsubstituted C1 to C20 alkyl, C5 to C20 aryl, C6 to C20 alkylaryl, C3 to C20 cycloalkyl, or C6 to C30 multicycloalkyl, $X_3$ is H, substituted or unsubstituted C1 to C20 alkyl, C5 to C20 aryl, C6 to C20 alkylaryl, C3 to C20 cycloalkyl, or C6 to C30 multicycloalkyl, k is 0 or 1, m is an integer ranging from 0 to 20, and n is an integer ranging from 0 to 20, with the proviso that when k is 0, $X_3$ is hydrogen.

The term 'multicycloalkyl' refers to cycloalkyl with plural rings that are fused.

The photosensitive resin composition for a color filter may further include one or more other additives (F).

Since a photosensitive resin composition for a color filter according to the present invention can have excellent heat resistance and chemical resistance and thus, excellent hole and pattern characteristic, it can be used to form a color filter on TFT array substrates to provide a high aperture ratio and a high contrast ratio.

Hereinafter, the components of the photosensitive resin composition for a color filter are illustrated in detail.

(A) Acrylic-Based Binder Resin

The acrylic-based binder resin includes a structural unit represented by the following Chemical Formula 1.

[Chemical Formula 1]

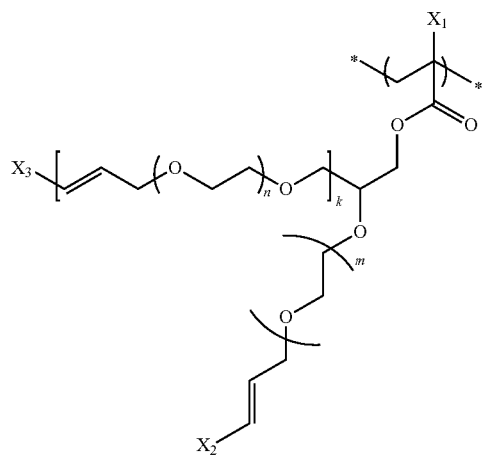

In Chemical Formula 1, $X_1$ is H or C1 to C30 alkyl, $X_2$ is substituted or unsubstituted C1 to C20 alkyl, C5 to C20 aryl, C6 to C20 alkylaryl, C3 to C20 cycloalkyl, or C6 to C30 multicycloalkyl, $X_3$ is H, substituted or unsubstituted C1 to C20 alkyl, C5 to C20 aryl, C6 to C20 alkylaryl, C3 to C20 cycloalkyl, or C6 to C30 multicycloalkyl, k is 0 or 1, m is an integer ranging from 0 to 20, and n is an integer ranging from 0 to 20, with the proviso that when k is 0, $X_3$ is hydrogen.

When k is 0 in the structural unit of the above Chemical Formula 1, the acrylic-based binder resin may include the structural unit represented by the following Chemical Formula 2.

[Chemical Formula 2]

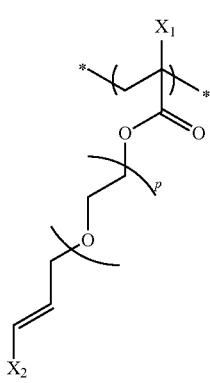

In Chemical Formula 2, $X_1$ is H or C1 to C30 alkyl, $X_2$ is substituted or unsubstituted C1 to C20 alkyl, C5 to C20 aryl, C6 to C20 alkylaryl, C3 to C20 cycloalkyl, or C6 to C30 multicycloalkyl, and p is an integer ranging from 1 to 10.

When k is 1 in the structural unit of the above Chemical Formula 1, the acrylic-based binder resin may include the structural unit represented by the following Chemical Formula 3.

[Chemical Formula 3]

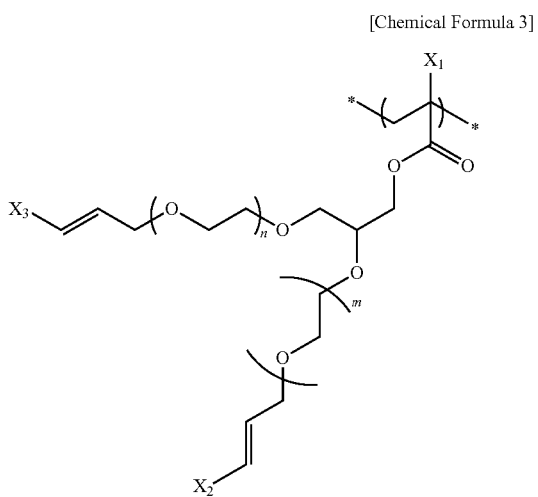

In Chemical Formula 3, $X_1$ is H or C1 to C30 alkyl, $X_2$ and $X_3$ are the same or different and are each independently substituted or unsubstituted C1 to C20 alkyl, C5 to C20 aryl, C6 to C20 alkylaryl, C3 to C20 cycloalkyl, or C6 to C30 multicycloalkyl, m is an integer ranging from 0 to 20, and n is an integer ranging from 0 to 20.

The acrylic-based binder resin may include the structural unit represented by Chemical Formula 2 or Chemical Formula 3, or both structural units represented by Chemical Formulae 2 and 3.

The structural unit represented by Chemical Formula 1 may be obtained from copolymerization of a first ethylenic unsaturated monomer including at least one carboxyl group and a second ethylenic unsaturated monomer being capable of being copolymerized therewith to form a copolymer.

Examples of the first ethylenic unsaturated monomer may include without limitation (meth)acrylic acid, maleic acid, itaconic acid, fumaric acid, and the like and combinations thereof.

The copolymer may include the first ethylenic unsaturated monomer in an amount of about 1 to about 50 wt %, for example about 3 to about 40 wt %, and as another example about 5 to about 30 wt % based on the total weight of the copolymer. In some embodiments, the copolymer may include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

When the first ethylenic unsaturated monomer is included in an amount within the above range, desired developability, heat resistance, and chemical resistance may be provided.

Examples of the second ethylenic unsaturated monomer may include without limitation aromatic vinyl compounds such as styrene, α-methylstyrene, vinyltoluene, vinylbenzyl-methylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile, and the like; and unsaturated amide compounds such as (meth)acrylamide, and the like. These monomers may be used singularly or as a mixture of two or more.

In another embodiment of the present invention, the acrylic-based binder resin may include the structural unit of Chemical Formula 1 in an amount of about 0.05 to about 70 wt %, for example about 0.1 to about 50 wt %, based on the total weight of the acrylic-based binder resin. In some embodiments, the acrylic-based binder resin may include the structural unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the structural unit represented by Chemical Formula 1 can be in a range from about any of the foregoing amounts to about any other of the foregoing amounts.

When the structural unit represented by Chemical Formula 1 is included in an amount within the above range, heat resistance and chemical resistance may be improved.

In another embodiment of the present invention, the acrylic-based binder resin can include both structural units represented by Chemical Formula 2 and Chemical Formula 3, and the sum of the structural units represented by Chemical Formula 2 and Chemical Formula 3 may be included in an amount of about 0.05 to about 70 wt %, based on the total weight of the acrylic-based binder resin. In some embodiments, the acrylic-based binder resin may include both the structural units represented by Chemical Formula 2 and Chemical Formula 3 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of both of the structural units represented by Chemical Formula 2 and Chemical Formula 3 can be in a range from about any of the foregoing amounts to about any other of the foregoing amounts.

The acrylic-based binder resin may further include at least one of the structural units represented by Chemical Formulae 4-1 to 4-5, or a combination thereof.

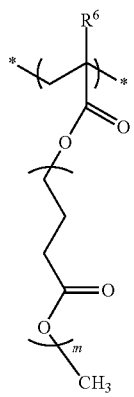
[Chemical Formula 4-1]

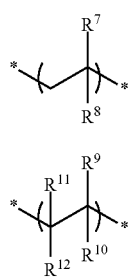
[Chemical Formula 4-2]

[Chemical Formula 4-3]

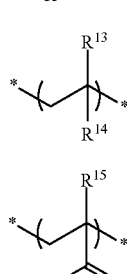
[Chemical Formula 4-4]

[Chemical Formula 4-5]

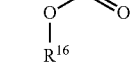

In Chemical Formulae 4-1 to 4-5, $R^6$, $R^7$, $R^9$, $R^{11}$, $R^{13}$ and $R^{15}$ are the same or different and are independently hydrogen or C1 to C10 alkyl, $R^8$ is hydrogen, halogen, hydroxyl, carboxyl, substituted or unsubstituted C1 to C20 alkyl, or COR'COOH (wherein R' is substituted or unsubstituted C1 to C20 alkylene or substituted or unsubstituted C1 to C20 alkoxylene), $R^{10}$ is carboxyl or CONHR" (wherein R" is substituted or unsubstituted C1 to C20 alkyl or substituted or unsubstituted C6 to C30 aryl), $R^{12}$ is carboxyl, or $R^{15}$ and $R^{12}$ are fused with each other to provide a ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

At least one of the structural units represented by the above Chemical Formulae 4-1 to 4-5 has a similar structure to a photoreaction functional group included in a photopolymerization monomer described below and thus, may promote the formation of cross-linking bonds in the acrylic-based binder resin (A) due to a photopolymerization reaction, when a radical introduced by a photopolymerization initiator also as described below is added thereto.

The cross-linking of at least one of the structural units represented by the above Chemical Formulae 4-1 to 4-5 may be controlled by a ratio between the photopolymerization monomer and a photopolymerization initiator described below.

The acrylic-based binder resin can include at least one structural unit represented by the above Chemical Formulae 4-1 to 4-5, or a combination thereof, and thus can promote the formation of a fine pattern and also provide excellent heat and chemical resistance, which are important in a color filter fabricated in a COA method and the like.

When the acrylic-based binder resin includes at least one of structural units represented by the above Chemical Formulae 4-1 to 4-5, or a combination thereof, the structural unit may be included in an amount ranging from about 1 to about 70 wt %, for example about 2 to about 50 wt %, based on the total weight of the acrylic-based binder resin (A). In some embodiments, the acrylic-based binder resin may include the structural unit represented by Chemical Formulae 4-1 to 4-5, or a combination thereof, in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the structural unit represented by Chemical Formulae 4-1 to 4-5, or a combination thereof, can be in a range from about any of the foregoing amounts to about any other of the foregoing amounts.

When one or more of the structural units represented by the above Chemical Formulae 4-1 to 4-5 is included in an amount within the above range, the composition may have excellent chemical resistance and excellent pattern stability with minimal or no deterioration of light transmission characteristics.

When the acrylic-based binder resin includes all the structural units represented by the above Chemical Formulae 4-1 to 4-5, each structural unit is included in an amount of $n^1$, $n^2$, $n^3$, $n^4$, and $n^5$ mol, wherein $0 \leq n^1 \leq 50$, $0 \leq n^2 \leq 50$, $0 \leq n^3 \leq 50$, $0 \leq n^4 \leq 50$, and $1 \leq n^5 \leq 50$, for example $1 \leq n^1 \leq 40$, $1 \leq n^2 \leq 40$, $1 \leq n^3 \leq 40$, $1 \leq n^4 \leq 40$, and $3 \leq n^5 \leq 40$. When the structural units represented by the above Chemical Formulae 4-1 to 4-5 are included in an amount within the above ratio range, the composition may have appropriate developability, heat resistance, and chemical resistance.

The acrylic-based binder resin may have a weight average molecular weight of about 1,000 to about 200,000 g/mol, for example about 5,000 to about 50,000 g/mol. When the acrylic-based binder resin has a weight average molecular weight within the above range, the photosensitive resin composition may have excellent developability.

The acrylic-based binder resin may have an acid value of about 20 to about 200 mgKOH/g, for example about 50 to about 160 mgKOH/g. When the acrylic-based binder resin has an acid value within the above range, the photosensitive resin composition may have excellent developability.

The photosensitive resin composition may include the acrylic-based binder resin in an amount ranging from about 1 to about 60 wt %, for example from about 3 to about 30 wt %, based on the total weight of the photosensitive resin composition. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, the composition may have excellent developing property in an alkali developing solution, decreased surface roughness due to good cross-linking, and excellent chemical resistance and thus, no or minimal stripped pattern.

(B) Acrylic-Based Photopolymerizable Monomer

Examples of the acrylic-based photopolymerizable monomer may include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenolA diacrylate, trimethylolpropane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

The photosensitive resin composition may include the acrylic-based photopolymerizable monomer in an amount of about 0.5 to about 40 wt % based on the total weight of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the acrylic-based photopolymerizable monomer can be in a range from about any of the foregoing amounts to about any other of the foregoing amounts.

When the acrylic-based photopolymerizable monomer is included in an amount within the above range, a pattern may have a neat edge and good developability in an alkali developing solution.

(C) Photopolymerization Initiator

Examples of the photopolymerization initiator may include without limitation triazine-based compounds, acetophenone-based compounds, benzophenone-based compounds, thioxanthone-based compounds, benzoin-based compound oxime-based compounds, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphto-1-yl)-4,6-bis(trichloro methyl)-s-triazine, 2-(4-methoxy naphto-1-yl)-4,6-bis(trichloro methyl)-s-triazine, 2,4-trichloro methyl(piperonyl)-6-triazine, 2,4-(trichloro methyl (4'-methoxy styryl)-6-triazine, and the like, and combinations thereof.

Examples of the acetophenone-based compound may include without limitation 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, and combinations thereof.

Examples of the benzophenone-based compound may include without limitation benzophenone, benzoyl benzoic acid, benzoyl benzoic acid methyl, 4-phenyl benzophenone, hydroxy benzophenone, acrylated benzophenone, 4,4'-bis (dimethyl amino)benzophenone, 4,4'-dichloro benzophenone, 3,3'-dimethyl-2-methoxy benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyl dimethyl ketal, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may further include a carbazole-based compound, a diketone-based compound, a sulfonium borate-based compound, a diazo-based compound, a biimidazole-based compound, and the like, or a combination thereof.

The photosensitive resin composition may include the photopolymerization initiator in an amount of about 0.1 to about 20 wt % based on the total weight of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19 or 20 wt %. Further, according to some embodiments of the present invention, the amount of the photopolymerization initiator can be in a range from about any of the foregoing amounts to about any other of the foregoing amounts. When the photopolymerization initiator is included in an amount within the above range, the composition may be sufficiently photopolymerized when exposed during the pattern-forming process and may exhibit minimal or no transmittance deterioration due to non-reacted initiator remaining after the photopolymerization.

(D) Pigment

The pigment can include red, green, blue, yellow, and violet colors. Examples of the pigment may include without limitation anthraquinone-based pigments, condensed polycyclic pigments such as perylene-based pigments and the like, phthalocyanine pigments, azo-based pigments, and the like. The pigments can be used singularly or in combination of two or more. The combination of two or more pigments can help adjust maximum absorption wavelength, cross point, crosstalk, and the like.

The pigment may be included in a photosensitive resin composition for a color filter as a pigment dispersion solution.

In addition, the pigment may include a dispersing agent, so that the pigment component can be uniformly dispersed. Examples of the dispersing agent may include nonionic, anionic, and cationic dispersing agents, and combinations thereof. Examples of the dispering agents include without limitationpolyalkylene glycols and esters thereof, polyoxyalkylenes, polyhydric alcohol ester alkylene oxide additives, alcoholalkyleneoxide additives, sulfonic acid esters, sulfonic acid salts, carboxylic acid esters, carboxylic acid salts, alkyl amide alkylene oxide additives, alkylamines, and the like. These dispersing agents can be used singularly or as a combination of two or more.

In addition, a carboxyl-containing acrylic-based resin as well as the dispersing agent can be added to the pigment in order to improve pixel patterning properties as well as stability of a pigment dispersion solution.

The pigment can have a primary particle diameter ranging from about 10 to about 80 nm, for example about 10 to about 70 nm. When the pigment has a primary particle diameter within the above range, it can have excellent stability in a dispersion solution without deteriorating resolution of pixels.

The photosensitive resin composition may include the pigment in an amount of about 0.1 to about 40 wt % based on the total weight of the photosensitive resin composition. In some embodiments, the photosensitive resin composition may include the pigment in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment can be in a range from about any of the foregoing amounts to about any other of the foregoing amounts. When the pigment is included in an amount within the above range, the composition may have appropriate coloring effects and developing performance.

(E) Solvent

Examples of the solvent may include without limitation ethylene glycol acetate, ethyl cellosolve, ethyl ethoxy propionate, ethyl lactate, polyethyleneglycol, and the like, and combinations thereof. Other examples of the solvent may include without limitation ethylene glycol-based compounds such as ethylene glycol, diethylene glycol, and the like; glycol ether-based compounds such as ethylene glycol monomethylether, diethylene glycol monomethylether, ethylene glycol diethylether, diethylene glycol dimethylether, and the like; glycol ether acetate-based compounds such as ethylene glycol monoethylether acetate, diethylene glycol monoethylether acetate, diethylene glycol monobutylether acetate, and the like; propylene glycols such as propylene glycol and the like; propylene glycol ether-based compounds such as propylene glycol monomethylether, propyleneglycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol ether acetate-based compounds such as propylene glycol monomethylether acetate, dipropyleneglycol monoethylether acetate, and the like; amide-based compounds such as N-methylpyrrolidone, dimethyl formamide, dimethyl acetamide, and the like; ketone-based compounds such as methyl ethyl ketone (MEK), methyl isobutyl ketone (MIBK), cyclohexanone, and the like; petroleum-based compounds such as toluene, xylene, solvent naphtha, and the like; and ester-based compounds such as acetic acid ethyl, acetic acid butyl, lactic acid ethyl, and the like. These compounds may be used in singularly or as a combination two or more.

The solvent may be used in a balance amount. In exemplary embodiments, the photosensitive resin composition may include the solvent in an amount of about 20 to about 90 wt %, based on the total weight of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is used in an amount within the above range, the photosensitive resin composition may have excellent coating properties and may maintain flatness when the composition is coated as an about 3 μm-thick or thicker film.

(F) Other additive(s)

The photosensitive resin composition for a color filter according to the present invention may further include a dispersing agent as described above other than the (A) to (F) components, so that a pigment (D) may be uniformly dispersed in a solvent (E).

In addition, the photosensitive resin composition may include one or more other additives such as malonic acid; 3-amino-1,2-propanediol; a silane-based coupling agent having a vinyl group or (meth)acryloxyl group; a leveling agent; a fluorine-based surfactant; a radical polymerization initiator, and the like, and combinations thereof to prevent a spot or a stain during the coating and a residue due to leveling characteristic or non-development. The amount of these additives may be readily determined by the skilled artisan without undue experimentation, and the amounts may vary depending on the desired composition properties.

According to one embodiment of the present invention, a photosensitive resin composition for a color filter may be coated to a thickness of about 3.1 to about 3.4 μm on a bare glass substrate or a glass substrate with about 500 to about 1500 Å-thick $SiN_x$ coating (a protective layer) using an appropriate method such as but not limited to spin coating, slit coating, and the like. The coated substrate can be exposed to radiation (is irradiated by a light) to form a pattern required for a color filter. After the radiation, the coated layer can be treated with an alkali developing solution to dissolve the unradiated part and form a pattern for a color filter. These processes can be repeated as many times as necessary depending on the number of R, G, and B colors required to form a color filter with a desired pattern. In addition, this image pattern may be cured by heating or radiating an active ray to further improve crack resistance, solvent resistance, and the like.

In general, since a negative photosensitive resin is not easily stripped by an organic solvent, its residue may contaminate a lower layer. In addition, since the negative photosensitive resin is more weakly adhered to a lower layer than a positive photosensitive resin, it may have a bigger under-cut. However, a photosensitive resin composition for a color filter according to the present invention may improve resistance of the negative photosensitive resin against a stripper and thus, prevent contamination of a lower layer and also, improve adherence to the lower layer.

Hereinafter, Examples and Comparative Examples are set forth below to explain the present invention in more detail. However, the following exemplary embodiments should be understood not to limit but explain the present invention.

EXAMPLES

Synthesis Examples 1 to 10

Synthesis of Acrylic-Based Binder Resin Including Structural Units Represented by Chemical Formulae 4-1 to 4-5

2,2'-azobis(2,4-dimethylvalero nitrile) as an initiator is added in an amount sufficient to provide 10 wt % of the total monomers in a flask with a cooler and an agitator, and the monomers in Table 1 are added thereto in each weight ratio. Then, 200 parts by weight of propylene glycol monomethyl ether acetate (PGMEA) as a solvent are added to 100 parts by weight of the initiator and the monomers. The mixture is slowly agitated under nitrogen atmosphere. The reactant is heated up to 75° C. and agitated for 8 hours to polymerize an acrylic-based binder resin including aliphatic hydrocarbon. The resulting acrylic-based binder resin solution has a solid content of 30 wt % and a weight average molecular weight of 12,000 to 17,000. The weight average molecular weights are reported in Table 1 and are polystyrene-reduced average molecular weights measured by using GPC (Gel Permeation Chromatography).

TABLE 1

|  | Synthesis Ex. 1 | Synthesis Ex. 2 | Synthesis Ex. 3 | Synthesis Ex. 4 | Synthesis Ex. 5 | Synthesis Ex. 6 | Synthesis Ex. 7 | Synthesis Ex. 8 | Synthesis Ex. 9 | Synthesis Ex. 10 |
|---|---|---|---|---|---|---|---|---|---|---|
| methacrylic acid | 15 | 15 | 20 | 20 | 20 | 15 | 15 | 15 | 20 | 20 |
| N-phenyl maleimide | — | 15 | 15 | 12.5 | — | — | — | — | — | — |
| Styrene | — | 15 | 5 | 12.5 | — | — | 10 | — | — | — |
| benzyl methacrylate | 85 | 35 | 60 | 35 | 80 | 70 | 30 | 35 | 30 | 30 |
| polyvalerolactone methacrylate | — | 10 | — | 10 | — | — | 20 | — | — | — |
| glycolmethacrylate | — | 10 | — | 10 | — | — | 15 | — | 50 | — |
| 2-hydroxyethylmethacrylate | — | — | — | — | — | 15 | — | 50 | — | 50 |
| molecular weight (Mw) | 15k | 15k | 16k | 15k | 15.5k | 15k | 16k | 16k | 15k | 16k |

Synthesis Examples 11 to 15

Synthesis of Acrylic-Based Binder Resin Including the Structural Unit of Chemical Formula 1 Prepared by Adding Cinnamyl Bromide to the Acrylic-Based Binder Resins of Synthesis Examples 6 to 10

Each polymerized copolymer of Synthesis Examples 6 to 10 is added into in a flask with a cooler and an agitator, at each ratio set forth in the following Table 2, and then cinnamyl bromide is added thereto. The temperature is increased to 40° C. under a nitrogen atmosphere. While the temperature is maintained at 40° C., triethylamine is added for 30 minutes in an amount set forth in the following Table 2 and the resultant product is maintained at 40° C. for 2 hours. After the reaction is finished, precipitated triethylammonium bromide is removed using a filter. The resulting acrylic-based binder resin solutions have a solid content of 32 to 49%, but PGMEA is added so that the solid conents are 30%. The weight average molecular weights are polystyrene-reduced average molecular weights measured by using GPC (Gel Permeation Chromatography).

TABLE 2

|  | Synthesis Ex. 11 | Synthesis Ex. 12 | Synthesis Ex. 13 | Synthesis Ex. 14 | Synthesis Ex. 15 |
|---|---|---|---|---|---|
| copolymer of Synthesis Ex. 6 | 100 | — | — | — | — |
| copolymer of Synthesis Ex. 7 | — | 100 | — | — | — |
| copolymer of Synthesis Ex. 8 | — | — | 100 | — | — |
| copolymer of Synthesis Ex. 9 | — | — | — | 100 | — |
| copolymer of Synthesis Ex. 10 | — | — | — | — | 100 |
| Cinnamyl bromide | 7.3 | 11.9 | 24.3 | 39.5 | 24.3 |
| triethylamine | 3.5 | 5.7 | 11.7 | 19 | 11.7 |
| weight averagemolecular weight (Mw) | 15000 | 17000 | 18000 | 18000 | 17000 |

Preparation of a Photosensitive Resin Composition for a Color Filter

Examples 1 to 5

Photosensitive resin compositions are prepared using the following components provided in Table 3. First, a photopolymerization initiator is dissolved in a solvent. The solution is agitated at a room temperature for 2 hours. The acrylic-based binder resins polymerized in Synthesis Examples 11 to 15 and acrylic-based photopolymerizable monomer are added and agitated for 2 hours at room temperature. Then, the pigment dispersion is added and the mixture is agitated for 1 hout at room temperature to prepare photosensitive resin compositions for a color filter. The resulting compositions are filtered three times to remove impurities.

TABLE 3

| Composition | Amount [g] |
|---|---|
| (A) acrylic copolymer (copolymers polymerized Synthesis Examples 11-15) | 6.0 |
| (B) acrylic-based photopolymerizable monomer | |
| dipentaerythritol hexaacrylate (DPHA) | 4.1 |

TABLE 3-continued

| Composition | Amount [g] |
|---|---|
| (C) photopolymerization initiator | |
| IGACURE OXE02 (Ciba Specialty Chemicals) | 0.2 |
| (D) pigment dispersion | 46.8 |
| BT-CF (Ciba Specialty Chemicals, red pigment) | 6.2 |
| 2RP-CF (Ciba Specialty Chemicals, yellow pigment) | 2.8 |
| BYK21208 (BYK, dispersing agent) | 2.4 |
| (A-1) acryl-based binder resin | 5.4 |
| PGMEA (solvent) | 30.0 |
| (E) solvent | |
| PGMEA | 24.0 |
| ethylethoxy propionate | 11.4 |
| (F) additive | |
| F-475 (DIC, fluorine-based surfactant) | 0.1 |

Comparative Examples 1 to 5

Photosensitive resin compositions for a color filter are prepared according to the same method as in Examples 1 to 5 except that (A) acrylic-based binder resins synthesized in Synthesis Examples 1 to 5 are used.

Patterning Property Evaluation

Figure 2:
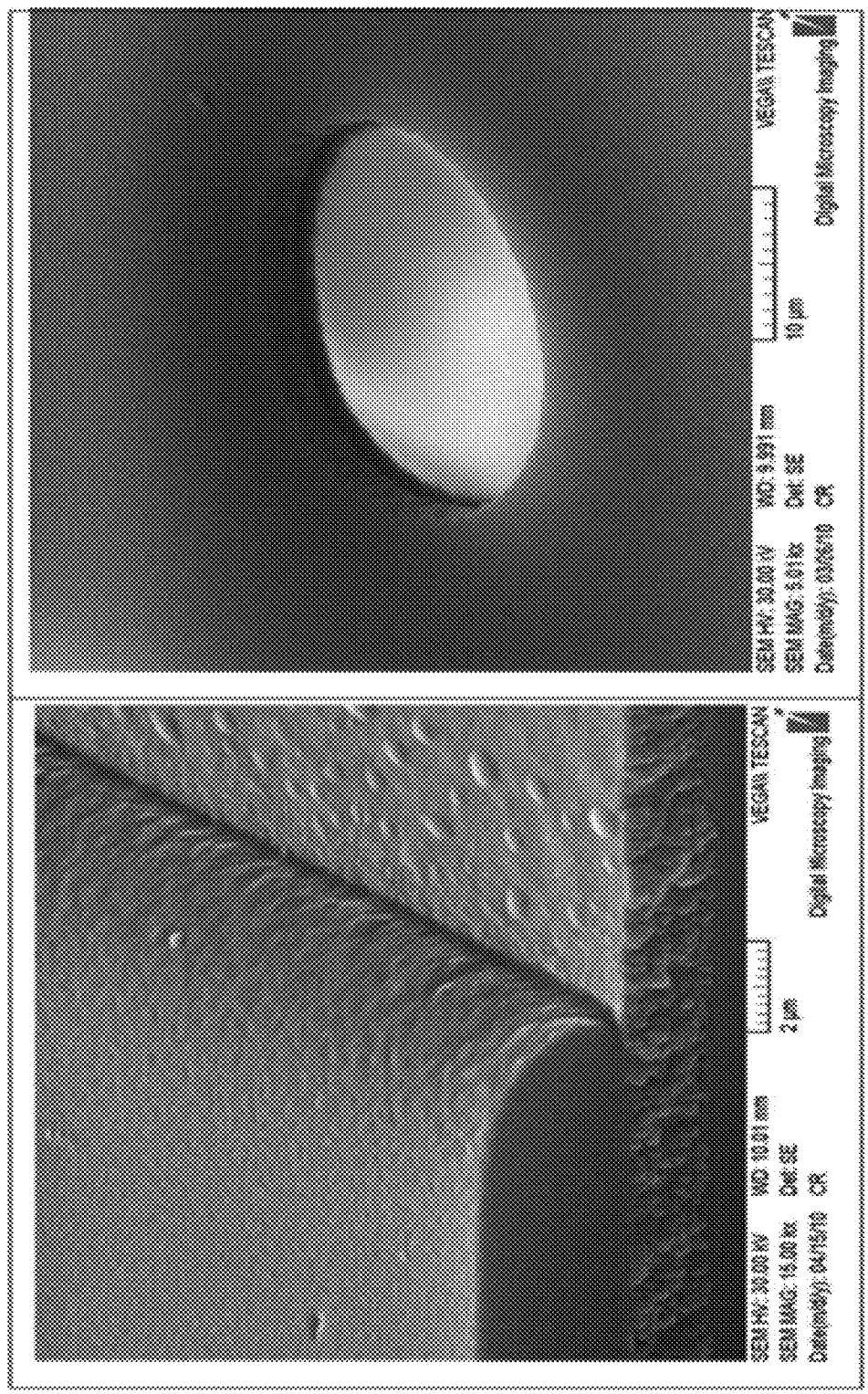
FIG. 2 is an electron scanning microscope photograph of the film manufactured using the photosensitive resin composition for a color filter according to Comparative Example 1.
Figure 3:
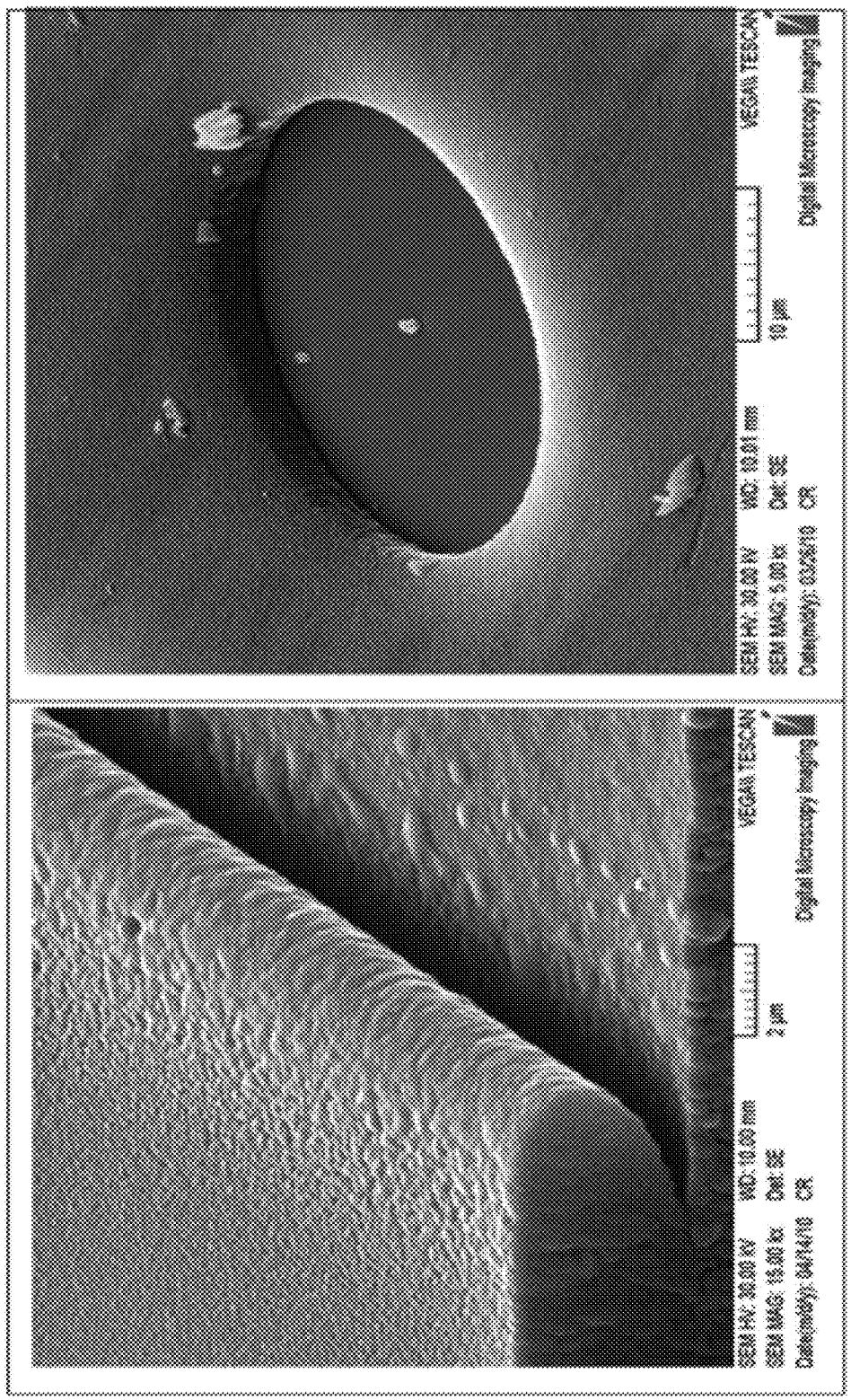
FIG. 3 is an electron scanning microscope photograph of the film manufactured using the photosensitive resin composition for a color filter according to Comparative Example 2.

The patterning properties of the photosensitive resin compositions according to Examples 1 to 5 and Comparative Examples 1 to 5 are evaluated as follows The photosensitive resin compositions according to Examples 1 to 5 and Comparative Examples 1 to 5, respectively, are coated to a thickness of 3 µm on a transparent disk bare glass substrate and a glass substrate coated with a 500 Å thick silicon nitride ($SiN_x$) layer using a spin-coater (K-Spin8, KDNS Co., Ltd.). The coated substrate is soft-baked at 80° C. for 150 seconds using a hot-plate, exposed to a light with power output of 60 mJ using an exposer (I10C, Nikon Inc.), developed at 25° C. for 60 seconds, and washed for 60 seconds and spin-dried for 25 seconds. A potassium hydroxide aqueous solution is used as a developing solution with a concentration of 1 wt %. Then, the developed product is hard-baked in a 230° C. oven for 30 minutes and evaluated using an electron scanning microscope. FIGS. 1 to 3 are images indicating patterning properties as follows. FIG. 1 is an image of Example 4 which indicates excellent patterning properties, FIG. 2 is an image of Comparative Example 1 which indicates unsatisfactory patterning properties, and FIG. 3 is an image of Comparative Example 4 which indicates bad patterning properties. The left images of FIGS. 1 to 3 show line patterns, and right images of FIGS. 1 to 3 show hole patterns.

Stripper Resistance Evaluation

The stripper resistance of the photosensitive resin compositions according to Examples 1 to 5 and Comparative Examples 1 to 5 is evaluated as follows.

The photosensitive resin compositions according to Examples 1 to 5 and Comparative Examples 1 to 5, respectively, are coated to a thickness of 3 µm thick on a transparent circular bare glass substrate and a glass substrate coated with a 500 Å thick silicon nitride ($SiN_x$) layer using a spin-coater (K-Spin8, KDNS Co., Ltd.). The coated composition is soft-baked at 80° C. for 150 seconds using a hot-plate, exposed to a light with power output of 60 mJ using an exposer (I10C, Nikon Inc.), developed at 25° C. for 60 seconds using a developer, and then, washed for 60 seconds and spin-dried for 25 seconds. A potassium hydroxide aqueous solution with a concentration of 1 wt % is used as a developing solution. Then, the developed product is hard-baked in a 230° C. oven for 30 minutes, dipped in a 70° C. stripping solution (PRS-2000, J. T. Baker Inc.) for 10 minutes, and washed and dried with deionized water (DIW).

The photosensitive resin composition film prepared according to the method is examined with an optical microscope. The results are provided in the following Table 4.

<Stripping State>

No stripping of a photosensitive resin composition film: excellent

Partial stripping of a photosensitive resin composition: unsatisfactory

Largely stripping of a photosensitive resin composition: bad

Heat Resistance Evaluation

The heat resistance of the photosensitive resin compositions according to Examples 1 to 5 and Comparative Examples 1 to 5 is evaluated as follows.

The photosensitive resin compositions according to Examples 1 to 5 and Comparative Examples 1 to 5, respectively, are coated to a thickness of 3 µm on a transparent circular bare glass substrate and a glass substrate coated with a 500 Å thick silicon nitride ($SiN_x$) layer using a spin-coater (K-Spin8, KDNS Co., Ltd.). The coated substrate is soft-baked at 80° C. for 150 seconds using a hot-plate, exposed to a light with power output of 60 mJ using an exposer (I10C, Nikon Inc.), developed at 25° C. for 60 seconds, and washed for 60 seconds and spin-dried for 25 seconds. A potassium hydroxide aqueous solution is used as a developing solution with a concentration of 1 wt %. Then, the developed product is hard-baked in a 230° C. oven for 30 minutes and baked again in a 230° C. oven for 2 hours and then the color change is measured using a spectrophotometer (MCPD3000, Otsuka Electronics Co., Ltd.). The results are provided in the following Table 4.

<Heat Resistance Evaluation>

Color change (ΔE) of less than 3: excellent

Color change (ΔE) ranging from more than 3 to less than 5: unsatisfactory

Color change (ΔE) of more than 5: bad

TABLE 4

| | Patterning property | | Stripping state | | Heat resistance | |
|---|---|---|---|---|---|---|
| | bare glass | SiN$x$ | bare glass | SiN$x$ | bare glass | SiN$x$ |
| Ex. 1 | good | unsatisfactory | unsatisfactory | good | good | good |
| Ex. 2 | good | unsatisfactory | unsatisfactory | good | good | good |
| Ex. 3 | good | good | good | good | unsatisfactory | unsatisfactory |
| Ex. 4 | good | good | good | good | good | good |
| Ex. 5 | good | good | unsatisfactory | good | good | good |
| Comparative Ex. 1 | unsatisfactory | bad | good | good | good | good |

TABLE 4-continued

|  | Patterning property | | Stripping state | | Heat resistance | |
| --- | --- | --- | --- | --- | --- | --- |
|  | bare glass | SiNx | bare glass | SiNx | bare glass | SiNx |
| Comparative Ex. 2 | good | bad | bad | good | unsatisfactory | unsatisfactory |
| Comparative Ex. 3 | bad | bad | bad | unsatisfactory | unsatisfactory | bad |
| Comparative Ex. 4 | bad | bad | unsatisfactory | unsatisfactory | unsatisfactory | bad |
| Comparative Ex. 5 | bad | good | bad | good | unsatisfactory | bad |

Referring to Table 4, the films obtained using photosensitive resin compositions according to Examples 1 to 5 of the present invention exhibit excellent properties of hole and line patterns, do not peel off, do not exhibit a color change after stripper treatment, and have good patterning properties due to good heat resistance and stripper resistance.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
   (A) an acrylic-based binder resin including a structural unit represented by the following Chemical Formula 1;
   (B) an acrylic-based photopolymerizable monomer;
   (C) a photopolymerization initiator;
   (D) a pigment; and
   (E) a solvent:

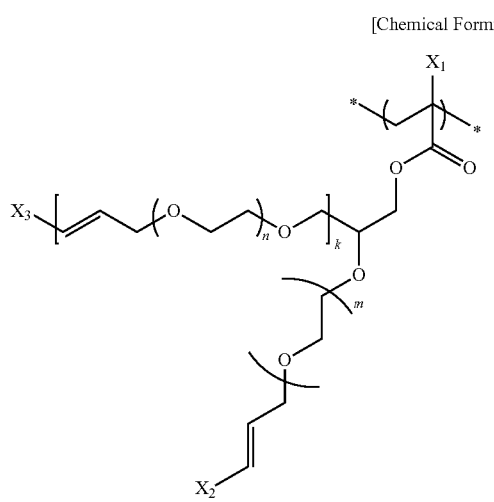

[Chemical Formula 1]

wherein, in Chemical Formula 1, $X_1$ is hydrogen or C1 to C30 alkyl, $X_2$ is substituted or unsubstituted C1 to C20 alkyl, C5 to C20 aryl, C6 to C20 alkylaryl, C3 to C20 cycloalkyl, or C6 to C30 multicycloalkyl, $X_3$ hydrogen, substituted or unsubstituted C1 to C20 alkyl, C5 to C20 aryl, C6 to C20 alkylaryl, C3 to C20 cycloalkyl, or C6 to C30 multicycloalkyl, k is 0 or 1, m is an integer ranging from 0 to 20, and n is an integer ranging from 0 to 20, with the proviso that when k is 0, $X_3$ is hydrogen.

2. The photosensitive resin composition for a color filter of claim 1, wherein the structural unit represented by Chemical Formula 1 is a structural unit represented by the following Chemical Formula 2 or Chemical Formula 3:

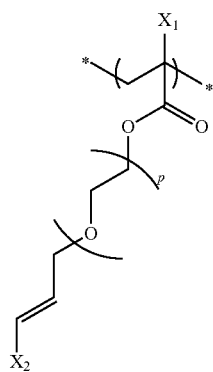

[Chemical Formula 2]

wherein, in Chemical Formula 2, $X_1$ is hydrogen or C1 to C30 alkyl, $X_2$ is substituted or unsubstituted C1 to C20 alkyl, C5 to C20 aryl, C6 to C20 alkylaryl, C3 to C20 cycloalkyl, or C6 to C30 multicycloalkyl, and p is an integer ranging from 1 to 10,

[Chemical Formula 3]

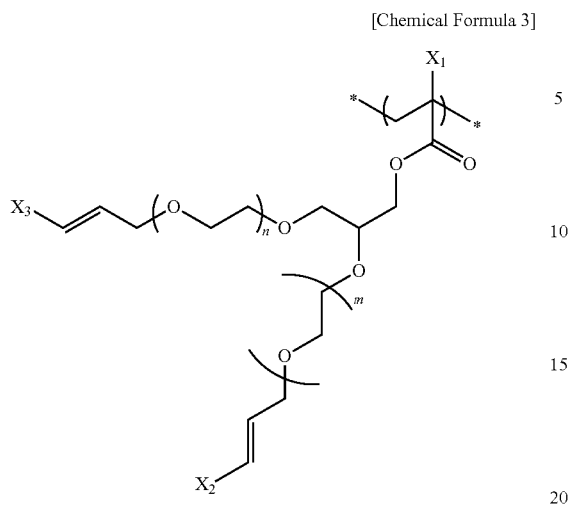

wherein, in the above Chemical Formula 3, $X_1$ is hydrogen or C1 to C30 alkyl, $X_2$ and $X_3$ are the same or different and are each independently substituted or unsubstituted C1 to C20 alkyl, C5 to C20 aryl, C6 to C20 alkylaryl, C3 to C20 cycloalkyl, or C6 to C30 multicycloalkyl, m is an integer ranging from 0 to 20, and n is an integer ranging from 0 to 20.

3. The photosensitive resin composition for a color filter of claim 2, wherein acrylic-based binder resin (A) includes the structural unit represented by Chemical Formula 1 in an amount of about 0.05 to about 70 wt. % based on the total weight of the acrylic-based binder resin (A).

4. The photosensitive resin composition for a color filter of claim 1, comprising about 1 to about 60 wt. % of the acrylic-based binder resin including the structural unit represented by Chemical Formula 1 (A);

about 0.5 to about 40 wt. % of the acrylic-based photopolymerizable monomer (B);

about 0.1 to about 20 wt. % of the photopolymerization initiator (C);

about 0.1 to about 40 wt. % of the pigment (D); and balance of the solvent (E).

5. The photosensitive resin composition for a color filter of claim 1, wherein the acrylic-based binder resin (A) including the structural unit represented by Chemical Formula 1 has a weight average molecular weight (Mw) of about 1,000 to about 200,000.

6. The photosensitive resin composition for a color filter of claim 1, wherein the acrylic-based binder resin (A) including the structural unit represented by Chemical Formula 1 has an acid value of about 20 to about 200 mgKOH/g.

7. The photosensitive resin composition for a color filter of claim 1, wherein the acrylic-based binder resin (A) including the structural unit represented by Chemical Formula 1 further comprises a structural units represented by Chemical Formulae 4-1 to 4-5, or a combination thereof:

[Chemical Formula 4-1]

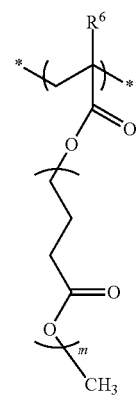

[Chemical Formula 4-2]

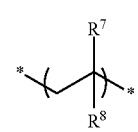

[Chemical Formula 4-3]

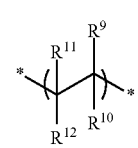

[Chemical Formula 4-4]

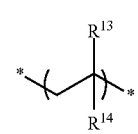

[Chemical Formula 4-5]

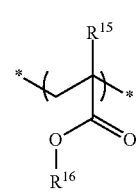

wherein, in Chemical Formulae 4-1 to 4-5, $R^6$, $R^7$, $R^9$, $R^{11}$, $R^{13}$ and $R^{15}$ are the same or different and are independently hydrogen or C1 to C10 alkyl, $R^8$ is hydrogen, halogen, hydroxyl, carboxyl, substituted or unsubstituted C1 to C20 alkyl, or COR'COOH wherein R' is substituted or unsubstituted C1 to C20 alkylene or substituted or unsubstituted C1 to C20 alkoxylene, $R^{10}$ is carboxyl or CONHR" wherein R" is substituted or unsubstituted C1 to C20 alkyl or substituted or unsubstituted C6 to C30 aryl, $R^{12}$ is carboxyl, or $R^{10}$ and $R^{12}$ are fused with each other to provide a ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

8. The photosensitive resin composition for a color filter of claim 7, wherein the acrylic-based binder resin (A) includes a structural units represented by Chemical Formulae 4-1 to 4-5, or a combination thereof, in an amount ranging from about 1 to about 70 wt % based on the total weight of the acrylic-based binder resin (A).

9. The photosensitive resin composition for a color filter of claim 1, wherein the photosensitive resin composition further comprises an additive comprising a dispersing agent; malonic acid; 3-amino-1,2-propanediol; a silane-based coupling agent including a vinyl group or a (meth)acryloxy group; a leveling agent; a fluorine-based surfactant; a radical polymerization initiator, or a mixture thereof.

10. A color filter manufactured using the photosensitive resin composition of claim 1.

* * * * *